United States Patent
Akahane

(10) Patent No.: US 11,736,094 B2
(45) Date of Patent: Aug. 22, 2023

(54) FILTER CIRCUIT AND SEMICONDUCTOR DEVICE

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 57 days.

(21) Appl. No.: 17/481,565

(22) Filed: Sep. 22, 2021

(65) Prior Publication Data

US 2022/0006447 A1  Jan. 6, 2022

Related U.S. Application Data

(63) Continuation of application No. PCT/JP2020/031733, filed on Aug. 21, 2020.

(30) Foreign Application Priority Data

Oct. 18, 2019  (JP) ................................ 2019-191374

(51) Int. Cl.
  *H03K 3/037* (2006.01)
  *H03K 17/22* (2006.01)
  *H03K 17/06* (2006.01)
  *H03K 17/687* (2006.01)
  *H03K 3/013* (2006.01)

(52) U.S. Cl.
  CPC ............. *H03K 3/037* (2013.01); *H03K 3/013* (2013.01); *H03K 17/063* (2013.01); *H03K 17/223* (2013.01); *H03K 17/687* (2013.01)

(58) Field of Classification Search
  None
  See application file for complete search history.

(56) References Cited

U.S. PATENT DOCUMENTS

| 6,903,590 B2 * | 6/2005 | Indoh .................. H03K 17/063 327/172 |
| 8,253,472 B2 | 8/2012 | Nishijima et al. |
| 9,515,637 B1 | 12/2016 | Schnaitter et al. |

(Continued)

FOREIGN PATENT DOCUMENTS

| JP | 5235705 A | 9/1993 |
| JP | 1131956 A | 2/1999 |

(Continued)

OTHER PUBLICATIONS

Written Opinion of the International Searching Authority dated Sep. 4, 2020 from International Application No. PCT/JP2020/031733, 4 pages.

(Continued)

*Primary Examiner* — Kenneth B Wells

(57) ABSTRACT

To provide a filter circuit and a semiconductor device capable of preventing circuit malfunction even when power supply voltage fluctuates. A filter circuit includes: a latch circuit configured to latch a set signal input to a first input terminal and a reset signal input to a second input terminal, respectively; and a rise adjustment unit configured to make a rise time of the set signal or the reset signal at power-on shorter than a time specified by a time constant circuit arranged in a preceding stage of the latch circuit.

14 Claims, 6 Drawing Sheets

(56) References Cited

U.S. PATENT DOCUMENTS

| | | | |
|---|---|---|---|
| 9,722,601 B2 | 8/2017 | Niikura et al. | |
| 10,841,133 B2 * | 11/2020 | Liu | G05F 3/262 |
| 11,070,202 B2 | 7/2021 | Ishimatsu | |
| 2004/0212408 A1 | 10/2004 | Indoh | |
| 2011/0043269 A1 | 2/2011 | Nishijima et al. | |
| 2011/0101940 A1 * | 5/2011 | Kudo | H01L 24/40 |
| | | | 323/282 |
| 2012/0154007 A1 | 6/2012 | Imanishi et al. | |
| 2016/0065205 A1 | 3/2016 | Niikura et al. | |
| 2021/0075418 A1 | 3/2021 | Ishimatsu | |

FOREIGN PATENT DOCUMENTS

| | | |
|---|---|---|
| JP | 2003152515 A | 5/2003 |
| JP | 2004260730 A | 9/2004 |
| JP | 20076048 A | 1/2007 |
| JP | 201144770 A | 3/2011 |
| JP | 20129982 A | 1/2012 |
| JP | 2012130209 A | 7/2012 |
| JP | 201339031 A | 2/2013 |
| JP | 201646775 A | 4/2016 |
| WO | 2019167827 A1 | 9/2019 |

OTHER PUBLICATIONS

International Search Report dated Sep. 4, 2020 from International Application No. PCT/JP2020/031733, 6 pages.

\* cited by examiner

FIG. 8
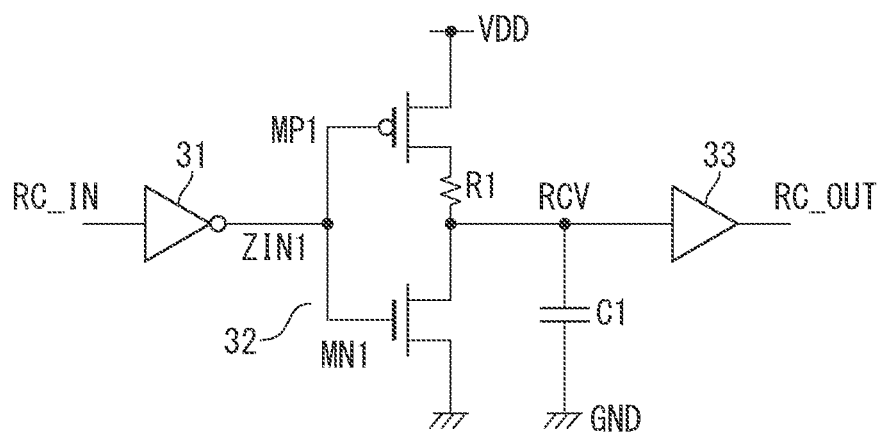
FIG. 9A RC_IN
FIG. 9B RCV
FIG. 9C RC_OUT

FILTER CIRCUIT AND SEMICONDUCTOR DEVICE

CROSS-REFERENCE TO RELATED APPLICATION

This application is a continuation application filed under 35 U.S.C. § 111(a) of International Patent Application No. PCT/JP2020/-031733, filed on Aug. 21, 2020, and claims the priority of Japanese Patent Application No. 2019-191374, filed on Oct. 18, 2019, the contents of which are incorporated herein by reference.

TECHNICAL FIELD

The present invention relates to a filter circuit and a semiconductor device mounted with the filter circuit.

BACKGROUND ART

Recent years have seen development of high-voltage IC (HVIC) technologies that achieve higher efficiency, energy saving, miniaturization, and higher reliability of internet data center (IDC) power supply systems such as servers and uninterruptible power supplies (UPSs). The HVIC is a high-voltage IC that drives the gate of a power device having a bridge circuit configuration (e.g., PTL 2).

In PTL 2, an HVIC is used to drive each of a high-side power MOS transistor and a low-side power MOS transistor connected by a half bridge.

Incidentally, in the above-described HVIC, for example, the high-side power MOS transistor is controlled to be conductive or non-conductive by a set pulse and a reset pulse. However, when power supply voltage fluctuates, for example, an RS flip-flop circuit that controls the set pulse and the reset pulse may malfunction. This may cause the high-side power MOS transistor and the low-side power MOS transistor to conduct at the same time, which affects system stability.

Note that PTL 1 proposes a configuration in which two power supplies (VDD and VBAT) are provided in a low potential side. In addition, PTL 2 proposes to form a time constant circuit by inserting a capacitor to be connected to a ground (GND) in a set side and inserting a capacitor to be connected to a power supply in a reset side. Additionally, PTL 3 proposes to eliminate an indefinite time of an RS flip-flop at power-on by connecting a capacitor to an output of the RS flip-flop. Furthermore, PTL 4 proposes a configuration in which a pull-up circuit or a pull-down circuit is provided between an output of an RS flip-flop and a power supply.

CITATION LIST

Patent Literature

PTL 1: JP 2012-9982 A
PTL 2: JP 2004-260730 A
PTL 3: JP 2003-152515 A
PTL 4: JP H5-235705 A

SUMMARY OF INVENTION

However, in PTL 1 above, a separate power supply needs to be prepared, which increases a circuit scale. In PTL 2 above, the capacitors are connected in different ways to prevent malfunction, but this is not applied to malfunction of the RS flip-flop. In PTL 3 above, another control circuit for determining an initial value is provided in an input side of the RS flip-flop, which increases a circuit scale. In PTL 4 above, it is necessary to provide another control circuit for determining an initial value in an input side of the RS flip-flop.

The present invention has been made by focusing on the above problem. It is an object of the present invention to provide a filter circuit and a semiconductor device capable of preventing circuit malfunction in a simple configuration even when power supply voltage fluctuates.

In order to achieve the above-described object, according to an aspect of the present invention, there is provided a filter circuit including: a latch circuit configured to latch a set signal input to a first input terminal and a reset signal input to a second input terminal, respectively; and a rise adjustment unit configured to make a rise time of the set signal or the reset signal at power-on shorter than a time specified by a time constant circuit arranged in a preceding stage of the latch circuit.

According to the present invention, it is possible to provide a filter circuit and a semiconductor device capable of preventing circuit malfunction in a simple configuration even when power supply voltage fluctuates.

BRIEF DESCRIPTION OF DRAWINGS

FIG. 8 is a circuit diagram illustrating a detailed configuration example of an RC time constant circuit of FIG. 2; and FIGS. 9A to 9C are timing charts illustrating operation of the RC time constant circuit illustrated in FIG. 8.

DETAILED DESCRIPTION

Embodiments of the present invention will be described below. In the following description of the drawings, the same or similar portions are denoted by the same or similar reference signs, and duplicate descriptions will be omitted.

First Embodiment

Figure 1:
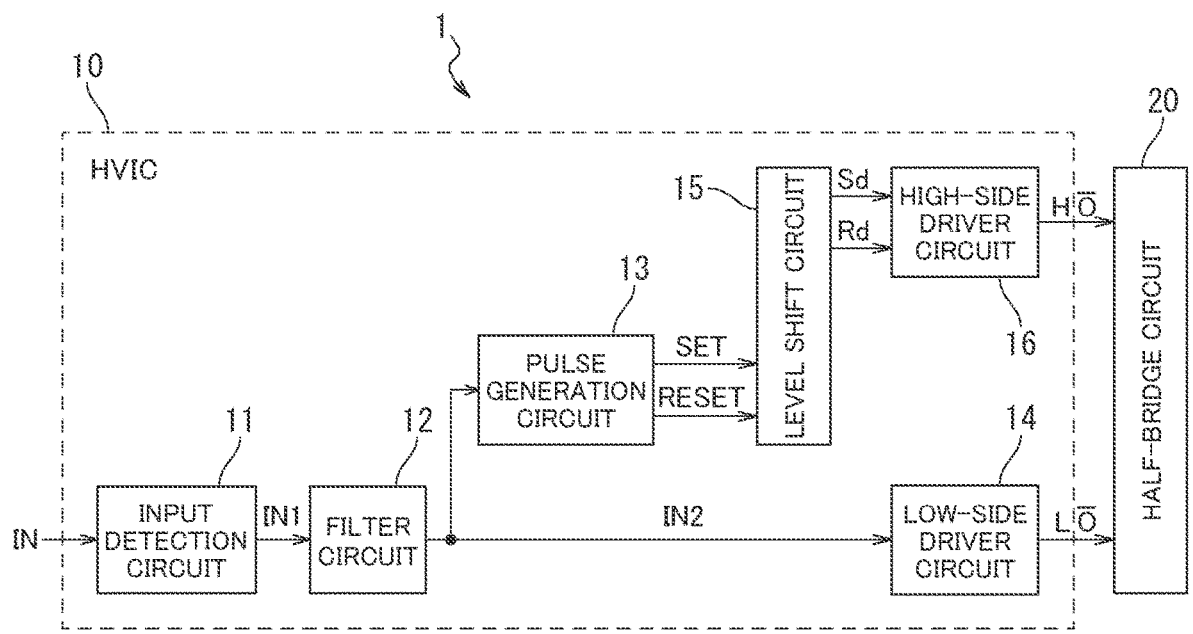
FIG. 1 is a block diagram illustrating a configuration example of a semiconductor device mounted with a filter circuit according to a first embodiment of the present invention.

FIG. 1 is a block diagram illustrating a configuration example of a semiconductor device mounted with a filter circuit according to a first embodiment of the present invention.

A semiconductor device 1 includes an HVIC 10 and a half-bridge circuit 20. The half-bridge circuit 20 includes a high-side power MOS transistor (not illustrated) and a low-side power MOS transistor (not illustrated) connected by a half bridge. For example, at a timing when an input signal switches from "L (low)" to "H (high)", the HVIC 10 outputs a signal to a gate terminal of the high-side power MOS transistor to drive the high-side power MOS transistor, and at a timing when the input signal switches from "H" to "L", the HVIC 10 outputs a signal to a gate terminal of the low-side power MOS transistor to drive the low-side power MOS transistor. The high-side power MOS transistor and the low-side power MOS transistor are alternately brought into a conductive state by the HVIC 10 to supply electric power to a load (not illustrated).

The HVIC 10 includes an input detection circuit 11, a filter circuit 12, a pulse generation circuit 13, a low-side driver circuit 14, a level shift circuit 15, and a high-side driver circuit 16. The input detection circuit 11 has a function of detecting the timing of driving the high-side power MOS transistor from a signal level of the input signal. The filter circuit 12 has a function of removing minute pulse noise of an output signal of the input detection circuit 11 and a function of delaying and latching the signal for a predetermined time. The pulse generation circuit 13 has a function of generating a set pulse for making the high-side power MOS transistor conductive in response to a rise of an output signal of the filter circuit 12 and generating a reset pulse for making the high-side power MOS transistor non-conductive in response to a fall of the output signal of the filter circuit 12. The low-side driver circuit 14 has a function of driving the low-side power MOS transistor in response to the output signal of the filter circuit 12. The level shift circuit 15 has a function of level shifting the output signal of the filter circuit 12 from a ground potential GND reference signal to a high-side reference potential signal by the set pulse and the reset pulse output from the pulse generation circuit 13. The high-side driver circuit 16 has a function of driving the high-side power MOS transistor in response to the output signal of the level shift circuit 15.

The input detection circuit 11 receives an input signal IN in which "H (high)" and "L (low)" are switched at a predetermined timing, and outputs an output signal IN1 to the filter circuit 12. Here, it is assumed that the high-side power MOS transistor is made conductive when the input signal input to the input detection circuit 11 rises from "L" to "H", and it is made non-conductive when the signal falls from "H" to "L".

An output signal IN2 of the filter circuit 12 is supplied to the pulse generation circuit 13 and the low-side driver circuit 14. The pulse generation circuit 13, which receives the output signal IN2 of the filter circuit 12, outputs a set pulse for making the high-side power MOS transistor conductive in response to a rise of the output signal IN2, and outputs a reset pulse for making the high-side power MOS transistor non-conductive in response to a fall of the output signal IN2. The level shift circuit 15 level shifts the output signal of the filter circuit 12 from the ground potential GND reference signal to the high-side reference potential signal by the set pulse and the reset pulse output from the pulse generation circuit 13, and outputs to the high-side driver circuit 16.

In response to the set pulse and the reset pulse output from the level shift circuit 15, the high-side driver circuit 16 selectively outputs a signal to the gate terminal of the high-side power MOS transistor to switch the high-side power MOS transistor to conductive or non-conductive. In response to the output signal IN2 of the filter circuit 12, the low-side driver circuit 14 selectively outputs a signal to the gate terminal of the low-side power MOS transistor to switch the low-side power MOS transistor to conductive or non-conductive.

Figure 2:
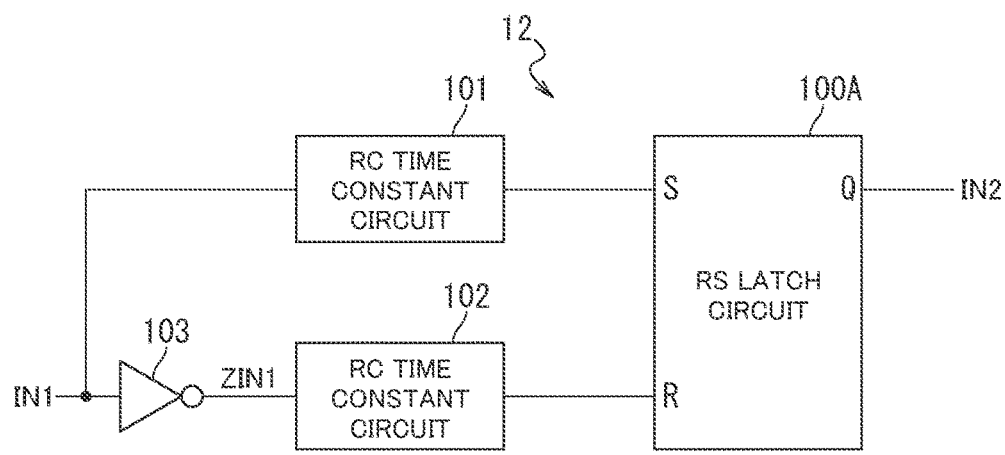
FIG. 2 is a block diagram illustrating an internal configuration example of the filter circuit according to the first embodiment of the present invention.

FIG. 2 illustrates an internal configuration of the above filter circuit 12.

The signal IN1 output from the input detection circuit 11 is supplied to an RC time constant circuit 101, as well as the signal level is inverted by an inverter circuit 103, and an inverted signal ZIN1 is supplied to an RC time constant circuit 102. The RC time constant circuit 101 outputs a set signal to an RS latch circuit 100A according to the input signal IN1. The RC time constant circuit 102 outputs a reset signal to the RS latch circuit 100A according to the signal ZIN1, which is the inversion of the signal IN1.

The RS latch circuit 100A is for latching the set signal and the reset signal. An output of the RS latch circuit 100A is output via an inverter circuit 104.

FIG. 8 illustrates an internal configuration of the RC time constant circuits 101 and 102.

The RC time constant circuits 101 and 102 are formed by inverter circuits 31 and 32 and a buffer circuit 33. The inverter circuit 32 is formed by a CMOS inverter circuit including a PMOS transistor MP1 and an NMOS transistor MN1 and an RC delay circuit including a resistor R1 and a capacitor C1. As illustrated in FIGS. 9A to 9C, the RC delay circuit gradually changes a rise of a node voltage RCV (FIG. 9B) along a transient phenomenon curve determined by an RC time constant formed by the resistor R1 and the capacitor C1, and when the voltage reaches a threshold value Vth of the buffer circuit 33, a logic of an output signal RC_OUT (FIG. 9C) of the buffer circuit 33 is output to remove minute pulse noise from an input signal RC_IN (FIG. 9A) and delay the signal for a predetermined time.

Figure 3:
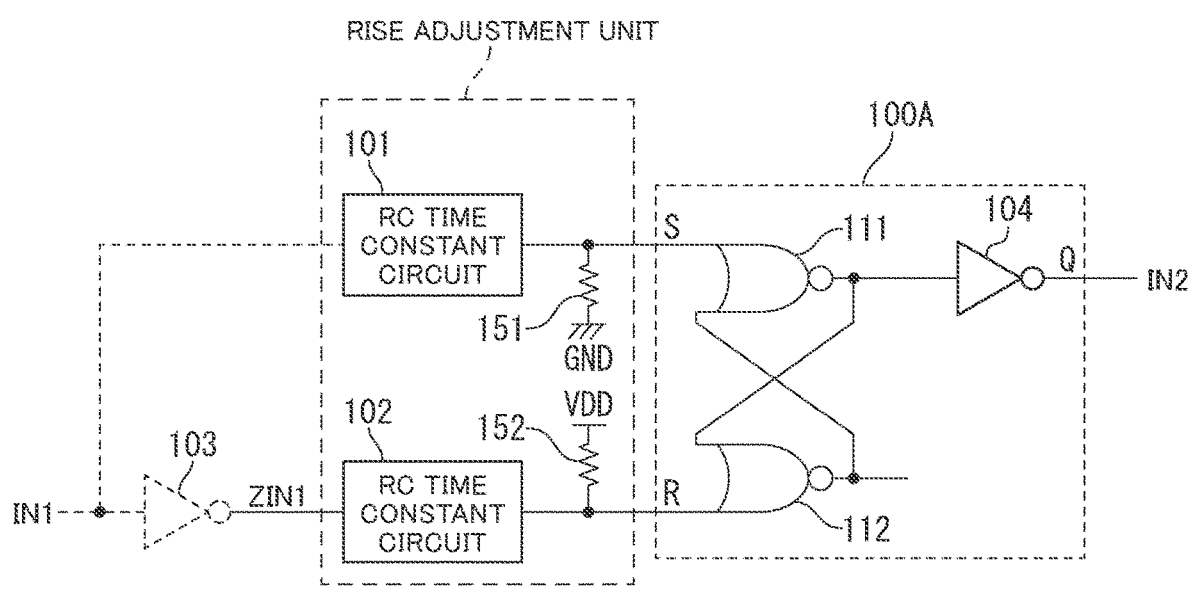
FIG. 3 is a circuit diagram illustrating a specific configuration of the filter circuit according to the first embodiment of the present invention.

FIG. 3 illustrates an example of a circuit configuration of the filter circuit 12.

The RS latch circuit 100A includes NOR circuits 111 and 112. A pull-down resistor 151 is connected between an S terminal of the RS latch circuit 100A and a ground (GND). Additionally, a pull-up resistor 152 is connected between an R terminal of the RS latch circuit 100A and a power supply voltage line.

The set signal is output from the RC time constant circuit 101. The reset signal is output from the RC time constant circuit 102. The RC time constant circuits 101 and 102, the pull-down resistor 151, and the pull-up resistor 152 form a rise adjustment unit.

Next will be a description of operation of the filter circuit 12 having the configuration of FIG. 2.

Figure 4:
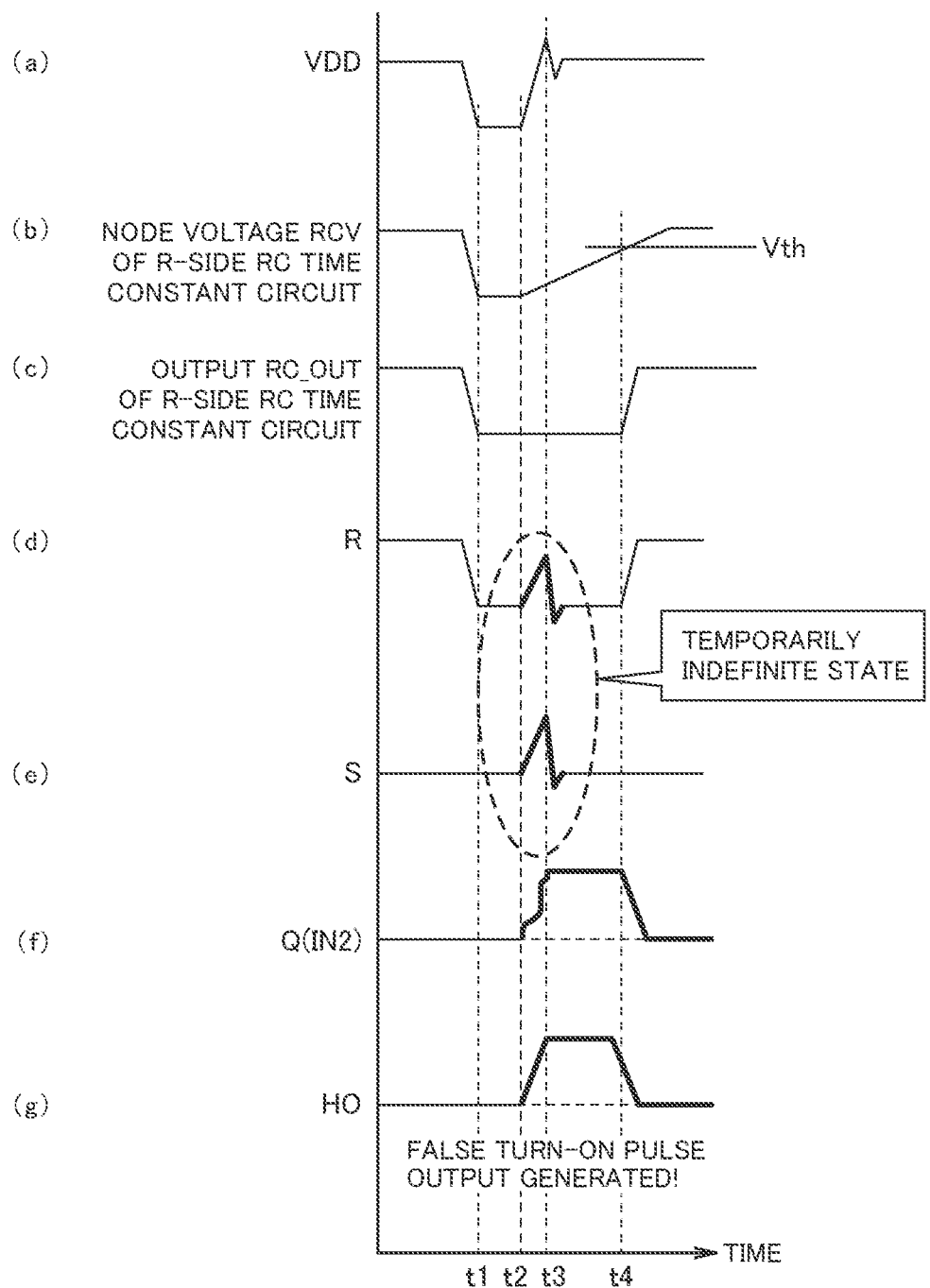
FIG. 4 is a timing chart illustrating operation of the filter circuit without pull-up and pull-down circuits.

In FIG. 4, when a power supply voltage VDD rises (between t2 and t3 in a part (a) of FIG. 4), the node voltage RCV (a part (b) of FIG. 4) of the RC time constant circuit 102 rises along a transient phenomenon curve determined by an RC time constant for a time until the voltage reaches a threshold value Vth, and the RC time constant circuit 102 outputs the output signal RC_OUT (a part (c) of FIG. 4). At this time, voltages (parts (e) and (d) of FIG. 4) applied to the S terminal and R terminal of the RS latch circuit 100A go to L level and H level, respectively, so that at a time point of t4, a voltage obtained at an output terminal Q of the RS latch circuit 100A is at L level.

However, voltages applied to the S terminal and R terminal of the RS latch circuit 100A when the power supply voltage VDD rises (between t2 and t4) go into a transient transition state from an L level and L level state to an L level and H level state. Therefore, immediately after power-on, the output terminal Q of the RS latch circuit 100A may go to H level unintentionally, as illustrated in a part (f) of FIG. 4. In such a state, a false turn-on pulse is generated from the RS latch circuit 100A (a part (g) of FIG. 4), thereby causing the high-side power MOS transistor and the low-side power MOS transistor to conduct simultaneously.

Thus, in the present first embodiment, the pull-down resistor 151 is connected between the S terminal of the RS latch circuit 100A and the ground (GND), and the pull-up resistor 152 is connected between the R terminal of the RS latch circuit 100A and the power supply voltage line. By doing this, even when the output voltage of the RC time constant circuit 102 has not reached the threshold value Vth, the set signal can be set to L level, and the reset signal to H level by suppressing the rise of the set signal, which becomes temporarily indefinite and changes at the rise of the power supply voltage VDD (between t2 and t3 in a part (a) of FIG. 5), by the pull-down resistor 151 (a part (e) of FIG. 5) and making the rise of the reset signal faster than the rise of the output of the RC time constant circuit 102 (a part (d) of FIG. 5). In other words, the rise time of the reset signal is set to be shorter than a time specified by the RC time constant circuit 102.

Figure 5:
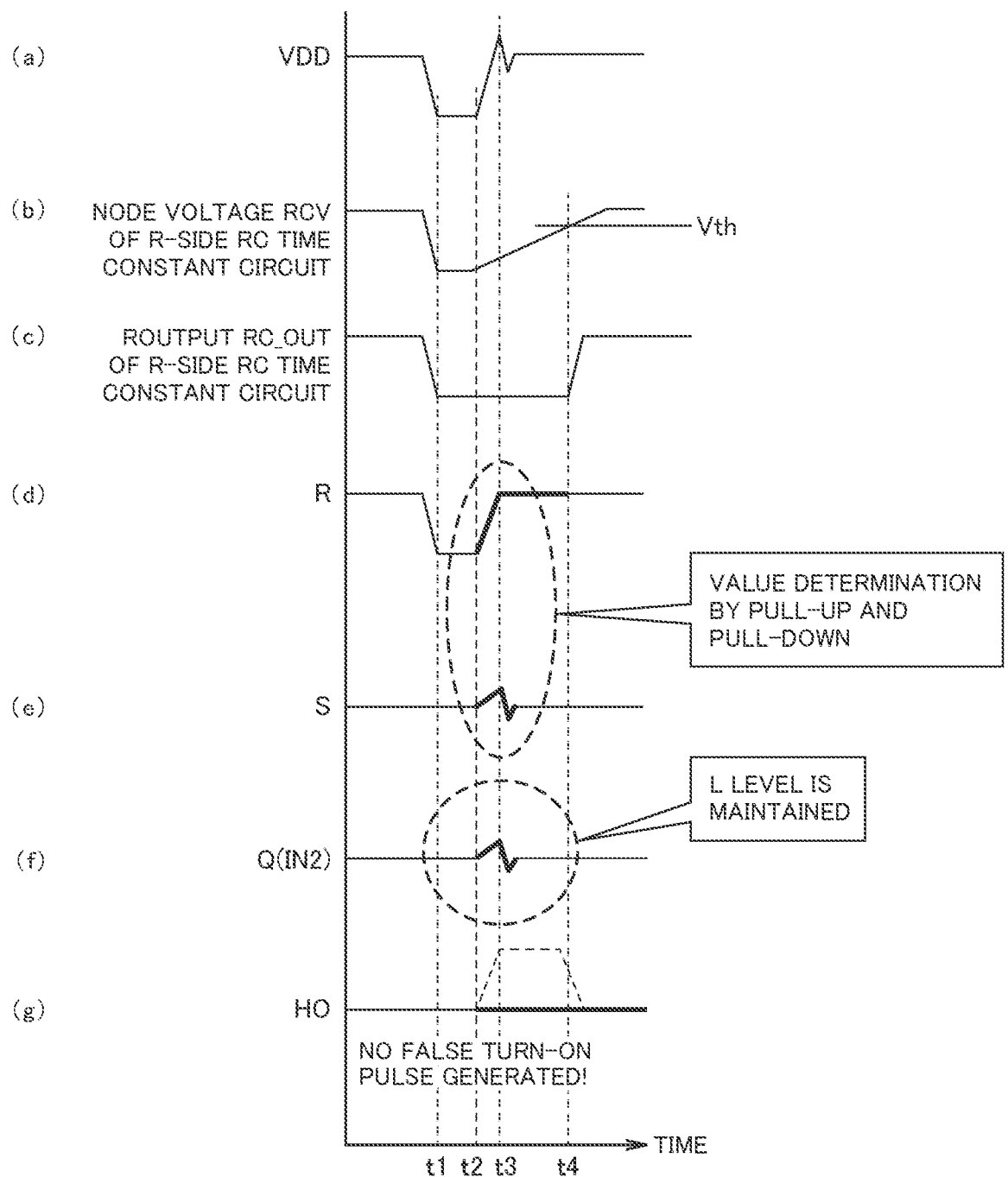
FIG. 5 is a timing chart illustrating operation of the filter circuit according to the first embodiment of the present invention.

Accordingly, a voltage obtained at the output terminal Q of the RS latch circuit 100A remains at L level (a part (f) of FIG. 5), and no false turn-on pulse is generated from the RS latch circuit 100A (a part (g) of FIG. 5).

As described above, according to the above first embodiment, even when the output voltage of the RC time constant circuit 102 that outputs the reset signal has not reached the threshold value Vth, the set signal can be surely determined to L level and the reset signal to H level by the effects of the pull-down resistor 151 and the pull-up resistor 152, which can prevent the output of the RS latch circuit 100A from malfunctioning.

Additionally, according to the above first embodiment, using the pull-down resistor 151 and the pull-up resistor 152 allows for an inexpensive configuration. Moreover, simply by adding the resistance elements small in circuit scale, no false pulse generation operation occurs after a momentary power interruption.

Modification

Figure 6:
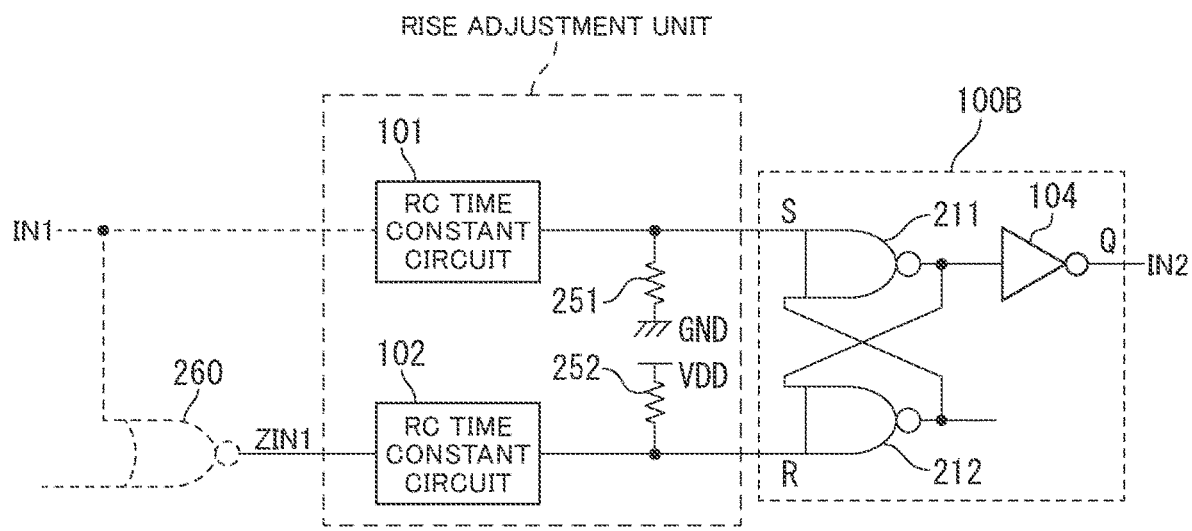
FIG. 6 is a circuit diagram illustrating a specific configuration of a filter circuit according to a modification of the first embodiment of the present invention.

FIG. 6 is a circuit diagram illustrating a specific configuration of a filter circuit 12 according to a modification of the first embodiment of the present invention. In FIG. 6, the same portions as those in FIG. 3 above are denoted by the same reference signs, and detailed description thereof will be omitted.

An RS latch circuit 100B includes NAND circuits 211 and 212 and the inverter circuit 104. A pull-down resistor 251 is connected between an S terminal of the RS latch circuit 100B and a ground (GND). Additionally, a pull-up resistor 252 is connected between an R terminal of the RS latch circuit 100B and a power supply voltage line.

Furthermore, an output of a NOR circuit 260 is supplied to the RC time constant circuit 102. The RC time constant circuits 101 and 102, the pull-down resistor 251, and the pull-up resistor 252 form a rise adjustment unit. The NOR circuit 260 receives the signal IN1 and a reset signal for initialization at power-on. The NOR circuit 260 generates the signal ZIN1 by a logical sum of the signal IN1 and the reset signal, and outputs the signal ZIN1 to the RC time constant circuit 102.

As described above, even in the above modification, the same functions and effects as those in the first embodiment above can be obtained.

Second Embodiment

Figure 7:
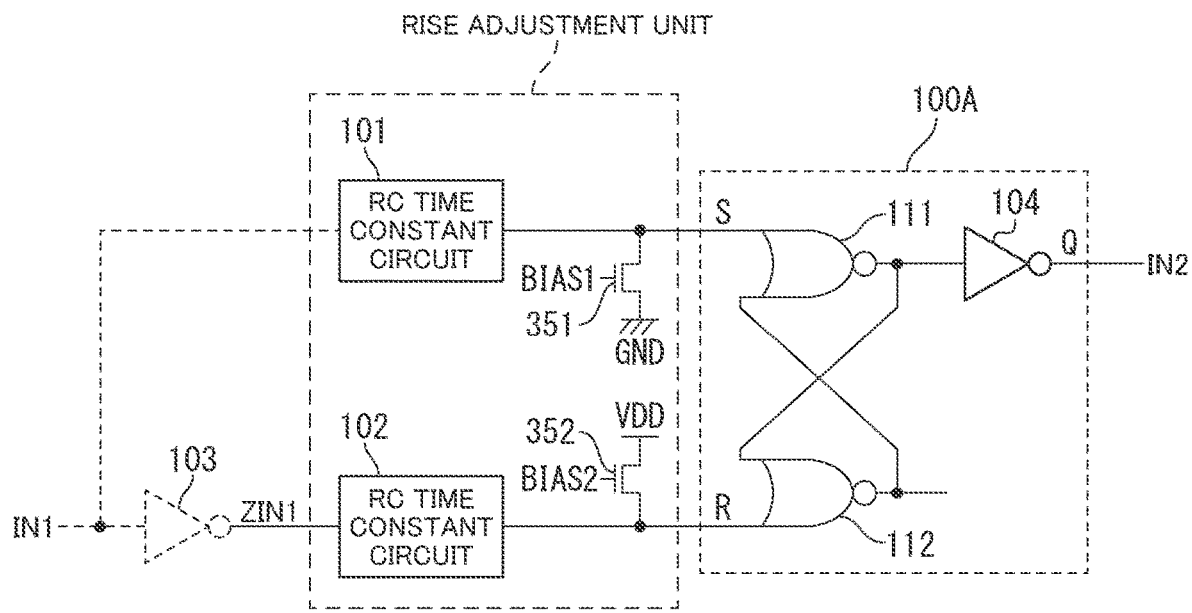
FIG. 7 is a circuit diagram illustrating a specific configuration of a filter circuit according to a second embodiment of the present invention.

FIG. 7 is a circuit diagram illustrating a specific configuration of a filter circuit 12 according to a second embodiment of the present invention. In FIG. 7, the same portions as those in FIG. 3 above are denoted by the same reference signs, and detailed description thereof will be omitted.

A MOS-FET 351 forming a pull-down circuit is connected between the S terminal of the RS latch circuit 100A and a ground (GND). Additionally, a MOS-FET 352 forming a pull-up circuit is connected between the R terminal of the RS latch circuit 100A and a power supply voltage line. Constant voltage biases (BIAS1 and BIAS2) are connected to gates of the MOS-FETs 351 and 352. The RC time constant circuits 101 and 102 and MOS-FETs 351 and 352 form a rise adjustment unit.

Even in the second embodiment, the same functions and effects as those in the first embodiment above can be obtained, and the HVIC 10 can be manufactured at low cost.

OTHER EMBODIMENTS

As described above, while the present invention has been described by the embodiments, the statements and drawings that form a part of this disclosure should not be understood as limiting the present invention. From this disclosure, various alternative embodiments and modifications will be apparent to those skilled in the art.

Each of the above-described embodiments has described the example where the pull-up circuit and the pull-down circuit are provided at both the S and R terminals of the RS latch circuits 100A and 100B. However, the present invention is not limited thereto, and either one of the pull-up circuit or the pull-down circuit may be provided as a rise adjustment unit.

Furthermore, each of the above-described embodiments has described the example of using the filter circuit 12 mounted in the HVIC 10. However, the present invention is not limited thereto, and the filter circuit 12 can be also applied to other semiconductor devices.

REFERENCE SIGNS LIST

1: Semiconductor device
10: HVIC
11: Input detection circuit
12: Filter circuit
13: Pulse generation circuit
14: Low-side driver circuit
15: Level shift circuit
16: High-side driver circuit
20: Half-bridge circuit
31, 32: Inverter circuit
33: Buffer circuit
100A, 100B: RS latch circuit
101, 102: RC time constant circuit
103, 104: Inverter circuit
111, 112, 260: NOR circuit
151, 251: Pull-down resistor
152, 252: Pull-up resistor
211, 212: NAND circuit
351, 352: MOS-FET

The invention claimed is:

1. A filter circuit comprising:
a latch circuit configured to latch a set signal input to a first input terminal and a reset signal input to a second input terminal, respectively; and
a rise adjustment unit configured to suppress a rise of the set signal at a rise of a power supply voltage and to make a rise of the reset signal faster than a rise of an output of a time constant circuit arranged in a preceding stage of the latch circuit.

2. The filter circuit according to claim 1, wherein the reset signal of the latch circuit is generated by a logical sum of an input signal to the rise adjustment unit and a reset signal for initialization at the power-on.

3. The filter circuit according to claim 1, wherein the rise adjustment unit includes a pull-up circuit configured to pull up one of inputs of the first and second input terminals and a pull-down circuit configured to pull down an other one of the inputs of the first and second input terminals.

4. The filter circuit according to claim 3, wherein the pull-up circuit and the pull-down circuit are formed by resistance elements.

5. The filter circuit according to claim 3, wherein the pull-up circuit and the pull-down circuit are formed by on-resistances.

6. A semiconductor device mounted with the filter circuit according to claim 1.

7. The filter circuit according to claim 2, wherein the rise adjustment unit includes a pull-up circuit configured to pull up one of inputs of the first and second input terminals and a pull-down circuit configured to pull down an other one of the inputs of the first and second input terminals.

8. A semiconductor device mounted with the filter circuit according to claim 2.

9. A semiconductor device mounted with the filter circuit according to claim 3.

10. A semiconductor device mounted with the filter circuit according to claim 4.

11. A semiconductor device mounted with the filter circuit according to claim 5.

12. A semiconductor device mounted with the filter circuit according to claim 7.

13. A filter circuit comprising:
a latch circuit configured to latch a set signal input to a first input terminal and a reset signal input to a second input terminal, respectively; and
a rise adjustment unit configured to make a rise time of the set signal or the reset signal at power-on shorter than a time specified by a time constant circuit arranged in a preceding stage of the latch circuit,
the reset signal of the latch circuit being generated by a logical sum of an input signal to the rise adjustment unit and a reset signal for initialization at the power-on.

14. A filter circuit comprising:
a latch circuit configured to latch a set signal input to a first input terminal and a reset signal input to a second input terminal, respectively; and
a rise adjustment unit configured to make a rise time of the set signal or the reset signal at power-on shorter than a time specified by a time constant circuit arranged in a preceding stage of the latch circuit,
the rise adjustment unit including a pull-up circuit configured to pull up one of inputs of the first and second input terminals and a pull-down circuit configured to pull down an other one of the inputs of the first and second input terminals.

* * * * *